(12) United States Patent
Murooka et al.

(10) Patent No.: US 6,248,508 B1
(45) Date of Patent: Jun. 19, 2001

(54) MANUFACTURING A CIRCUIT ELEMENT

(75) Inventors: Ken-ichi Murooka; Hitoshi Higurashi, both of Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/042,653

(22) Filed: Mar. 17, 1998

(30) Foreign Application Priority Data

Mar. 19, 1997 (JP) .................................................. 9-065639
Dec. 10, 1997 (JP) .................................................. 9-339902

(51) Int. Cl.⁷ ....................................................... G03F 7/22
(52) U.S. Cl. ........................ 430/394; 430/312; 430/396
(58) Field of Search ................................ 430/312, 394, 430/396

(56) References Cited

U.S. PATENT DOCUMENTS 5,229,645 * 7/1993 Nakashima ........................ 257/773
5,811,222 * 9/1998 Gardner .............................. 430/312
5,837,426 * 11/1998 Tseng .................................. 430/311

FOREIGN PATENT DOCUMENTS 3-1522    1/1991   (JP) .
3-44980   2/1991   (JP) .

* cited by examiner

*Primary Examiner*—Mark F. Huff
*Assistant Examiner*—Nicole Barreca
(74) *Attorney, Agent, or Firm*—Oblon, Spivak, McClelland, Maier & Neustadt, P.C.

(57) ABSTRACT

The present invention provides a method of manufacturing a circuit element which includes a step of performing first exposure for transferring a pattern having a narrowed portion for forming a particular pattern, onto an exposure-target substrate, and a step of moving the pattern in a direction not parallel to a segment forming an outer circumference of the narrowed portion and performing second exposure for transferring the pattern onto the exposure-target substrate.

28 Claims, 15 Drawing Sheets

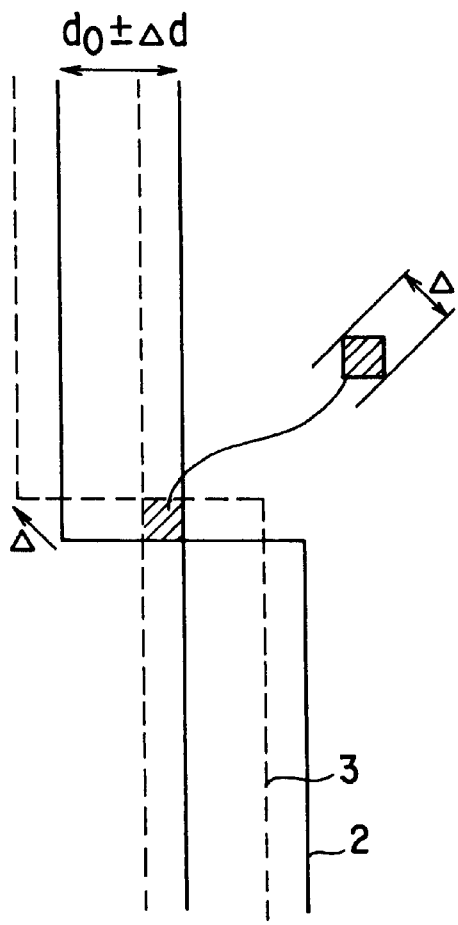
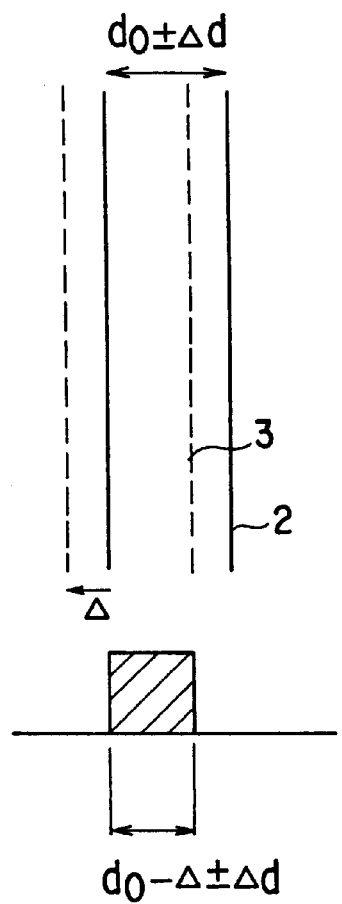
FIG. 15A
FIG. 15B
*PRIOR ART*

MANUFACTURING A CIRCUIT ELEMENT

BACKGROUND OF THE INVENTION

The present invention relates to a method of manufacturing a circuit element, and particularly, to a method of forming a fine structure element such as a single-electron tunneling element or the like.

In recent years, integration of various circuit elements including a semiconductor device has been promoted, accompanying downsizing of circuit patterns of LSI elements forming part of a circuit element. The downsizing of patterns not only has lead to narrowed wires of elements currently used, but also has required developments of circuit elements based on a new concept, since requisites for the operational principle of the concept cannot simply be achieved by downsizing.

As a countermeasure under consideration for responding to such a demand, a single-electron tunneling element has been proposed. A single-electron tunneling element forms a fine conductive material of 0.1 µm or less which is separated by tunneling barriers and utilizes a characteristic that electrostatic energy per electron in the conductive material is sufficiently large. Therefore, it is necessary to form fine patterns with high accuracy. Particularly, in order to prepare such a single-electron tunneling element operational at a normal temperature that is effective in practical use, it is required to form a conductive material of a level of several tens nm or less. However, it is difficult for a normal lithography method to form such a fine pattern with sufficient accuracy of, e.g., ±10% or less with respect to a designed size, which is equivalent to a range of plus and minus several nm or less.

Conventionally, a processing mode of a scanning tunnel microscope (STM) is used to prepare such a fine pattern in many cases. Processing using the STM achieves only a very low throughput, and therefore, cannot be adopted in mass-production in the future. Meanwhile, it has been attempted to form a polycrystal narrow wire having a wire width of about 0.1 µm or less by using a normal electron beam lithography method, and to obtain a desired characteristic by using connections at grain boundaries of polycrystal. However, there is a limit to artificial control of grain boundaries of polycrystal within the capacity of current techniques. It is therefore difficult to ensure uniformity over the entire surface of the substrate.

Thus, downsizing of elements has been accompanied by more and more difficulties in achieving both a high throughput and high accuracy. Not only in case of a single-electron tunneling element, but also in case of forming a fine pattern with a sufficient throughput and high accuracy, there is a problem that no effective method has been established.

The present invention has been made in view of the above situation and has an object of providing a method of manufacturing a circuit element, which is capable of forming a fine pattern with a useful throughput and useful accuracy, thereby to realize a fine circuit element such as a single-electron tunneling element or the like.

BRIEF SUMMARY OF THE INVENTION

To achieve an object as described above, of the first aspect of the present invention, there is provided a method of manufacturing a circuit element, comprising: a step of performing first exposure for transferring a pattern having a narrowed portion for forming a particular pattern, onto an exposure-target substrate; and a step of moving the pattern in a direction not parallel to a segment forming an outer circumference of the narrowed portion and performing second exposure for transferring the pattern onto the exposure-target substrate.

In addition, of the second aspect of the present invention, there is provided a method of manufacturing a circuit element, comprising: a step of forming a first insulating layer on a conductive substrate, a conductive layer on the first insulating layer, and a resist formed on the conductive layer; a step of performing first exposure for transferring a pattern having a narrowed portion for forming a particular pattern, onto the resist; a step of moving the pattern in a direction not parallel to a segment forming an edge of the narrowed portion, and of performing second exposure for transferring the pattern onto the resist, thereby to form a resist pattern; and a step of selectively etching the conductive layer with the resist pattern used as a mask.

Further, of the third aspect of the present invention, there is provided a single-electron tunneling element comprising: a first conductive layer formed on a semiconductor substrate, for forming a drain electrode; a second conductive layer formed on the semiconductor substrate, for forming a source electrode; a third conductive layer formed between the first and second conductive layers; a fourth conductive layer grounded and formed on the first conductive layer, with a first insulating layer inserted therebetween; a fifth conductive layer grounded and formed on the second conductive layer, with a second insulating layer inserted therebetween; a sixth conductive layer formed on the third conductive layer, with a third insulating layer inserted therebetween; and a seventh conductive layer formed on the sixth conductive layer, with a fourth insulating layer inserted therebetween, for forming a gate electrode.

Preferred embodiments of the present invention are as follows:

(1) The exposure-target substrate includes a conductive thin film and a positive resist, and the method comprises a step in which a pattern after developing is transferred onto the conductive thin film by reactive ion etching.

(2) A material whose oxide has an insulating characteristic is used as the conductive thin film, and the method comprises an oxidation step or an isotropic etching step after the step of reactive ion etching.

(3) Si is used as the conductive thin film, and the oxidation step is a thermal oxidation step.

(4) The parallel movement of the pattern is achieved by parallel movement of a mask stage on which a mask as an exposure original is mounted.

(5) The parallel movement of the pattern is achieved by parallel movement of an exposure target substrate stage on which the exposure-target substrate is mounted.

(6) The parallel movement of the stage is achieved by a piezoelectric element connected to the stage.

(7) The parallel movement of the pattern is achieved by parallel movement of a mirror included in an optical system for exposure.

(8) The method further comprises a step of forming a contact hole, a step of filling the contact hole with a conductive material, and a step of forming a wiring layer electrically connected with the conductive material filling the contact hole.

According to the present invention, first exposure is performed with respect to a pattern having a narrowed portion for forming a particular pattern, and thereafter, the pattern is moved parallel in a direction not parallel to a segment forming the outer circumference of the narrowed portion and second exposure is performed. In this manner, a pattern finer than a limit achieved by using a conventional exposure method can be formed with a practically useful throughput and accuracy.

The present invention thus contributes to realization of a fine structure element such as a single-electron tunneling element or the like.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 15A is a view for explaining a parallel movement of a mask in the method of manufacturing a circuit element in the present embodiment.

FIG. 15B is a view for explaining a conventional parallel movement of a mask.

DETAILED DESCRIPTION OF THE INVENTION

In the following, preferred embodiments of the present invention will be explained with reference to the drawings.

(First Embodiment)

Figure 1:
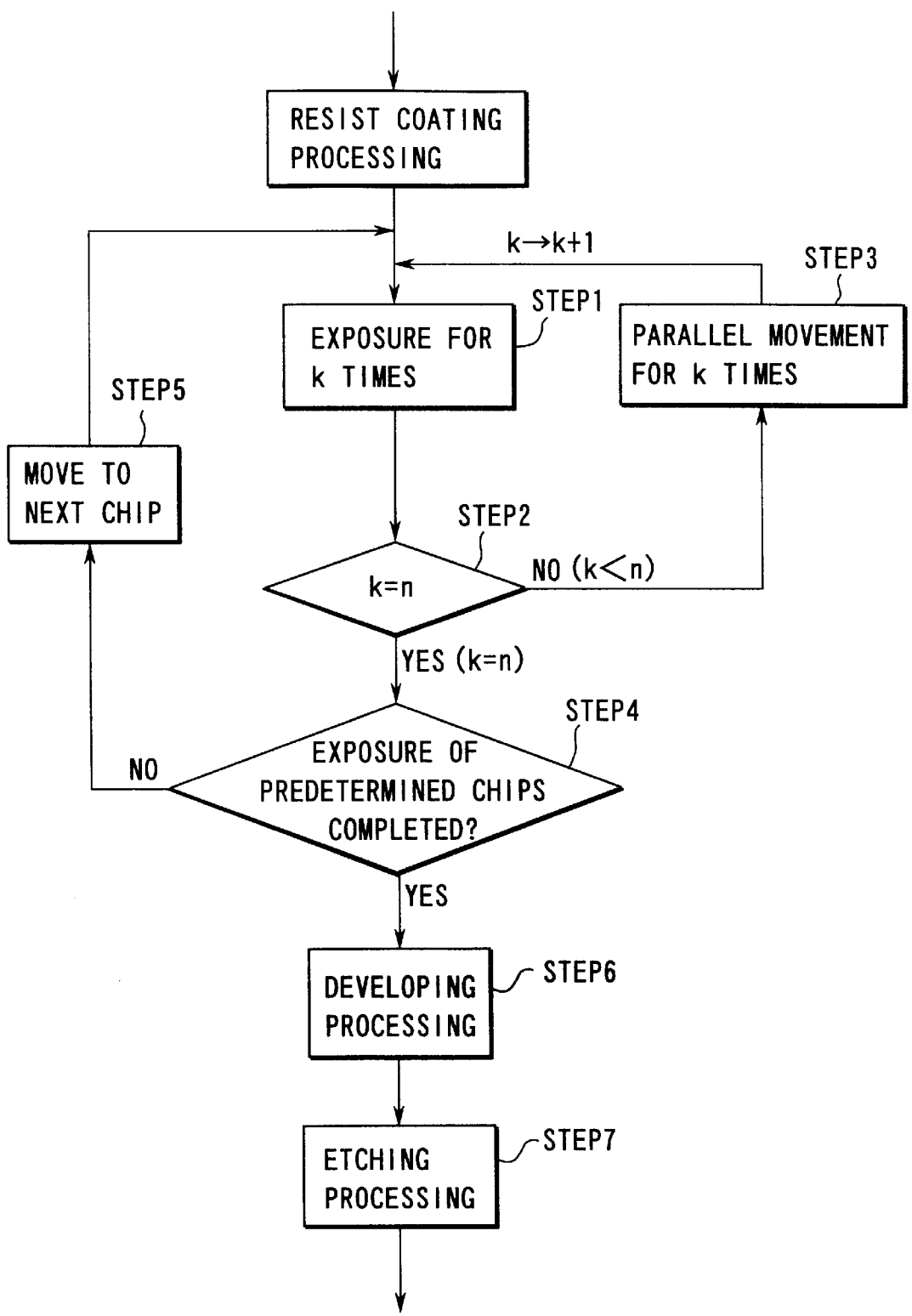
FIG. 1 is a flowchart for explaining steps of manufacturing a circuit element used in the first embodiment.

FIG. 1 is a flowchart showing a part of steps of manufacturing a circuit element used in the first embodiment.

As shown in the figure, a wafer coated with a resist is subjected to exposure for the first time with use of a mask. Thereafter, a step of moving parallel the mask or wafer with respect to each other and a step of performing exposure for a next (or second) time are carried out, and these steps are repeated until exposure for a n-th time is finished (in steps 1 to 3).

The parallel movement of the mask or wafer is carried out by moving the pattern of a mask pattern having a narrowed portion for forming a particular pattern in a direction not parallel to a segment forming an outer circumference of the narrowed portion.

Thereafter, exposure is carried out in a manner similar to the above at another predetermined chip position within the wafer by a step-and-repeat method (in steps 1 to 5). Further, after exposure is completed for all predetermined chips, developing and etching are carried out (in steps 6 and 7).

Figure 2A:
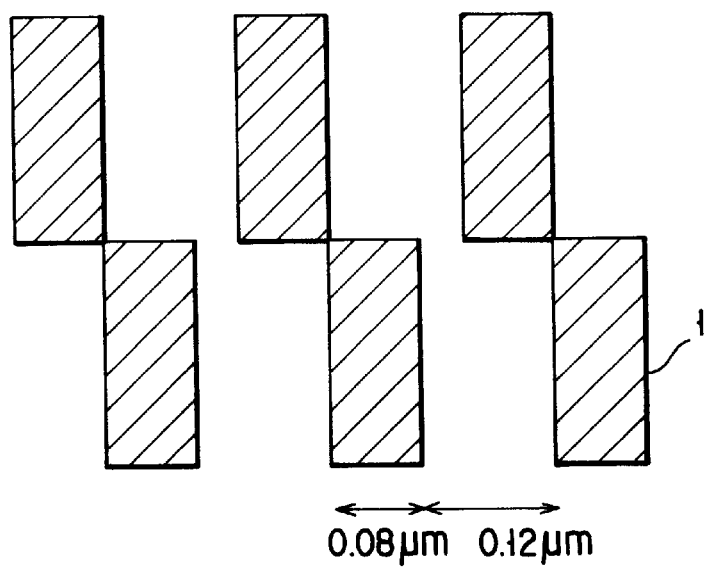
FIGS. 2A, 2B and 2C are plan views for explaining a pattern forming principle of the method of manufacturing a circuit element in the first embodiment.
Figure 2B:
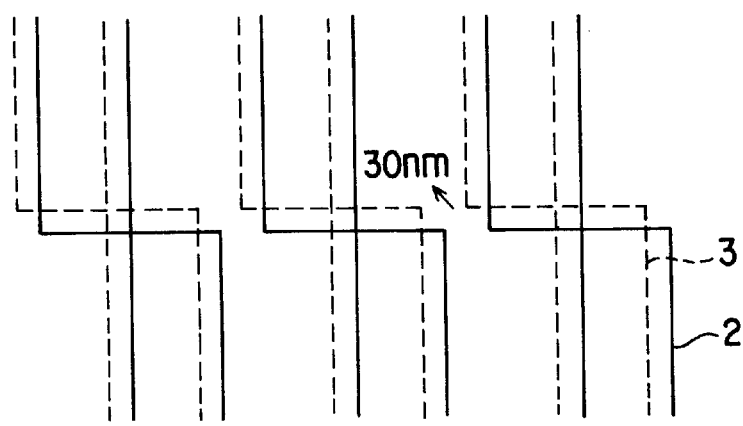
Figure 2C:
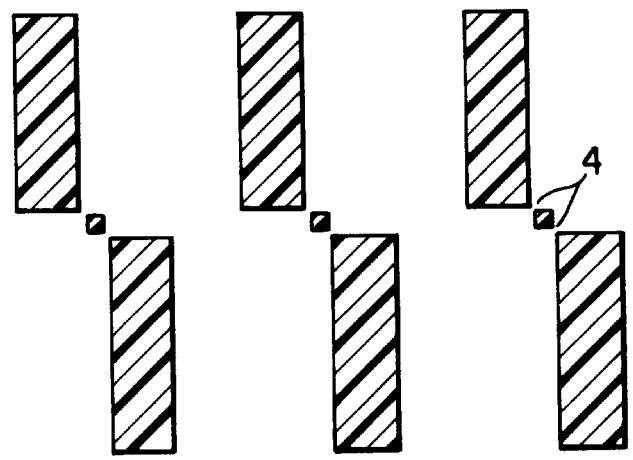

FIGS. 2A to 2C show an example of a pattern transferred in practice. FIG. 2A shows a pattern on a mask and this mask is used to perform exposure for a positive resist for two times between which a parallel movement in a direction indicated in FIG. 2B is taken. After developing, a resist pattern as shown in FIG. 2C is obtained.

This is because those portions which are not exposed by both of two transfer patterns still remain since the resist is of a positive type. Based on the resist pattern, processing of a conductive thin film is carried out, and then, a single-electron tunneling element of 30 nm is formed.

The parallel movement of the pattern is not limited to the direction indicated in FIG. 2B, but any direction is possible as long as the direction is not parallel to a segment forming the outer circumference of a narrowed portion of the pattern for forming a tunnel junction portion (which is the portion where two rectangular patterns have contact with each other in case of a pattern shown in FIG. 2A).

In FIG. 2A, the reference 1 denotes a light-shielding pattern formed on the mask. The reference 2 denotes a mask pattern transferred onto the wafer by exposure for the first time. The reference 3 denotes a mask pattern transferred onto the wafer by exposure for the second time. A reference 4 denotes a portion which forms a tunnel junction.

In practice, a number of elements as described above are two-dimensionally arranged, and integrated elements are manufactured. However, in case of elements according to the present embodiment, since the size which determines characteristics of an element is determined by the parallel movement amount, all elements are uniformly formed in a transfer area.

In case of using a conventional transfer method, the size of a pattern on a mask has a great influence on the size which determines characteristics of an element. Therefore, if sizes of finished masks vary in an exposure area, sizes of transferred patterns also vary. However, in case of the method of the present embodiment, influences from such variation in sizes of finished masks can be greatly reduced.

Although conventional techniques described in Japanese Patent Application KOKAI Publications No. 3-1522 and No. 3-44980 may appear to be similar to the present invention, both of these techniques aim to simply obtain a pattern having a small wire width, and therefore, cannot improve the accuracy of a pattern.

For example, as shown in FIG. 15B, a pattern obtained by the conventional techniques attains wire width accuracy of only $\Delta d/(d0-\Delta)$ where $d0$ is the wire width of an original pattern, $\Delta d$ is wire width variation, and $\Delta$ is a parallel movement amount. This wire width accuracy is apparently lower than the wire width accuracy $\Delta/d0$.

In contrast, according to the present embodiment, if the wire width of an original wire width includes variation $\Delta d$, the size of a pattern formed depends only on a parallel movement amount and does not depend on the variation $\Delta d$, as shown in FIG. 15A, and therefore, it is possible to obtain a pattern whose wire width has higher accuracy than that of an original pattern. The following will more specifically describe a method of manufacturing a circuit element using the present invention.

FIGS. 3A to 3D are cross-sections showing a part of steps of manufacturing a circuit element, according to the present invention.

Figure 3A:
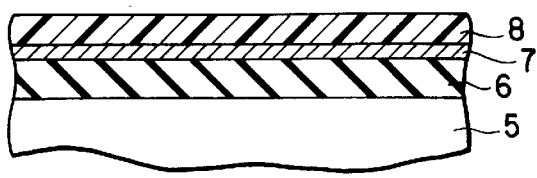
FIGS. 3A, 3B, 3C, 3D, 3E, 3F and 3G are cross-sections showing a part of the steps of manufacturing a circuit element, used in the first embodiment.

As shown in FIG. 3A, a thermal oxide film 6 of 200 nm is formed at a temperature of 950° C. on a Si substrate 5 subjected to cleaning processing by a diluted hydrofluoric acid, to electrically insulate an element to be formed from the substrate.

Subsequently, an amorphous Si film 7 of 30 nm is deposited by a LPCVD method under a condition of a substrate temperature 480° C. at a pressure 0.3 Torr, by using a disilane as source gas.

A positive resist (commercial name: ZEP-520) is coated on the amorphous Si film 7 by a rotational coating manner, and a heat treatment is performed for two minutes at 175° C., to form a resist 8 having a film thickness of 80 nm.

Figure 3B:
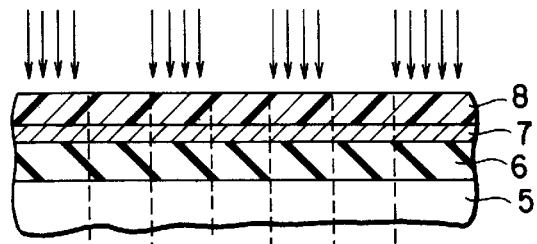
Figure 3C:
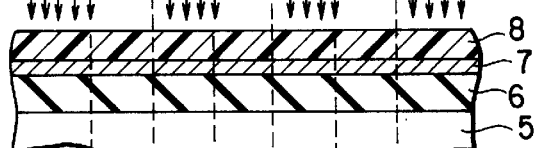

Next, as shown in FIGS. 3B and 3C, exposure is carried out with an X-ray. In this exposure, exposure light having a center wavelength of 0.8 nm is used, with a beam line used as a SOR light source comprising a mirror and a vacuum partition Be film.

Further, an X-ray mask of an absorbent having a mask contrast 9 which has a pattern as shown in FIG. 2A is used. At first, a mask pattern is transferred at a dose of 1100 mJ/cm$^2$ (FIG. 3B). Subsequently, a piezo element for making a fine movement of a stage on which the mask is mounted is driven to move parallel the mask by 30 nm, as shown in FIG. 2B, and transfer is carried out again with a dose of 1100 mJ/cm$^2$ (FIG. 3C). This operation is repeated by a so-called step-and-repeat manner to perform transfer over the entire surface of the Si substrate.

Figure 3D:
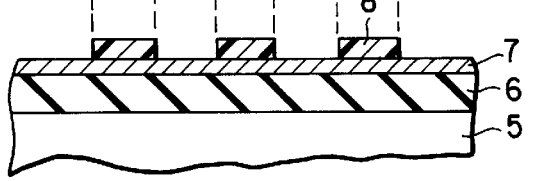

Next, developer (commercial name: ZEP-RD) is used to make processing for two minutes, and thereafter, a rinsing liquid (MIBK) is used to perform rinsing processing for one minute, to remove exposed portions of the resist 8, as shown in FIG. 3D.

Figure 3E:
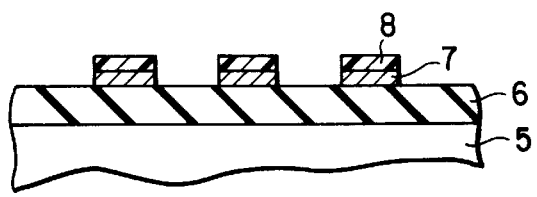

Subsequently, as shown in FIG. 3E, the amorphous Si film 7 is selectively etched with the resist 8 used as a mask, by reactive ion etching using a HBr gas.

Figure 3F:
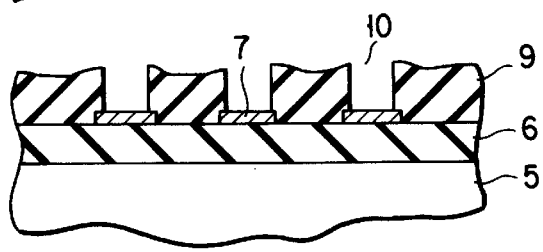

Further, as shown in FIG. 3F, a BPSG film 9 of 300 nm is formed as an insulating film after removal of the resist 8 which is not required any more. Thereafter, a pattern of an opening portion for connecting wires is formed by a lithography step, and an opening portion 10 which reaches Si is formed with use of a CHF$_3$ gas and a CO gas.

Figure 3G:
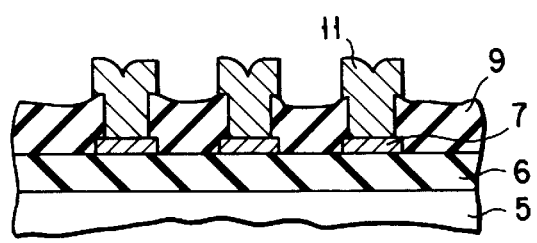

Next, as shown in FIG. 3G, the resist (not shown) which is not required any more is removed, and thereafter, a P-doped polysilicon film is formed to be 200 nm on the entire surface including the opening portion, by a LPCVD method. Further, a wiring pattern 11 is formed also by a lithography step and by reactive ion etching with use of a HBr gas.

This wiring pattern serves to connect a circuit element with another circuit element or an external terminal. Although such a connection can be formed with use of the amorphous Si film 7 used in a circuit element section, an amorphous Si film 7 has a small film thickness and a relatively high resistance, and therefore, a wire having a lower resistance is used.

Figure 4:
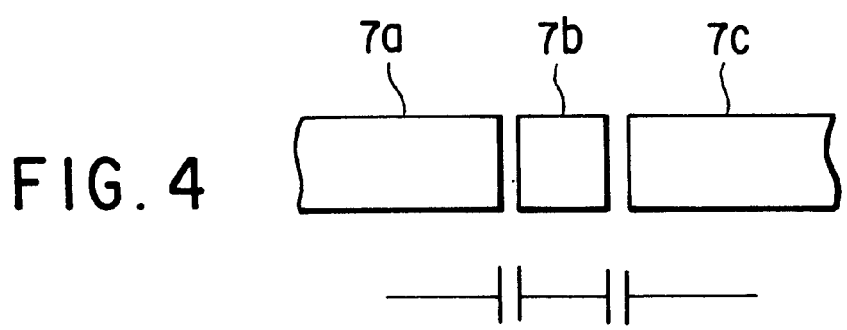
FIG. 4 is a view showing a basic structure of a single-electron tunneling element in the first embodiment.

The element formed of the amorphous Si film 7 schematically constitutes a single-electron tunneling element as shown in FIG. 4. That is, amorphous Si films 7a and 7B are arranged to be close to each other with a slight clearance interposed therebetween, and amorphous Si films 7b and 7c are also arranged to be close to each other with a slight gap, so that electrons can cause a tunneling effect between the films 7a and 7b as well as 7b and 7c.

As shown in FIG. 4, an equivalent circuit of the single-electron tunneling element is a circuit in which a capacitor between the films 7a and 7b and a capacitor between the films 7b and 7c are connected in series. Note that the element according to the method of the present embodiment has the same basic structure and operation as that shown in FIG. 4 although the element according to the method of the present embodiment adopts amorphous films 7a to 7c arranged obliquely as shown in FIG. 2C.

From an evaluation made as to the current/voltage characteristic of an element formed through the steps as described above, a column staircase was confirmed at a normal temperature (23° C.) as proof of single-electron tunneling.

Further, characteristic voltages of one hundred pieces of elements simultaneously formed were measured at a low temperature (4.2K) which provides certain measurement accuracy by avoiding thermal influences, and the results showed that the variation was 0.035V as a 3σ value and variation in a chip can be sufficiently reduced.

In the above embodiment, even if slight residues of resist in the exposure processing remain or slight tapering application occurs in the etching processing, portions to form a tunneling junction portion are connected directly with each other, thereby rendering it difficult to form a single-electron tunneling junction.

Figures 5A, 5B:
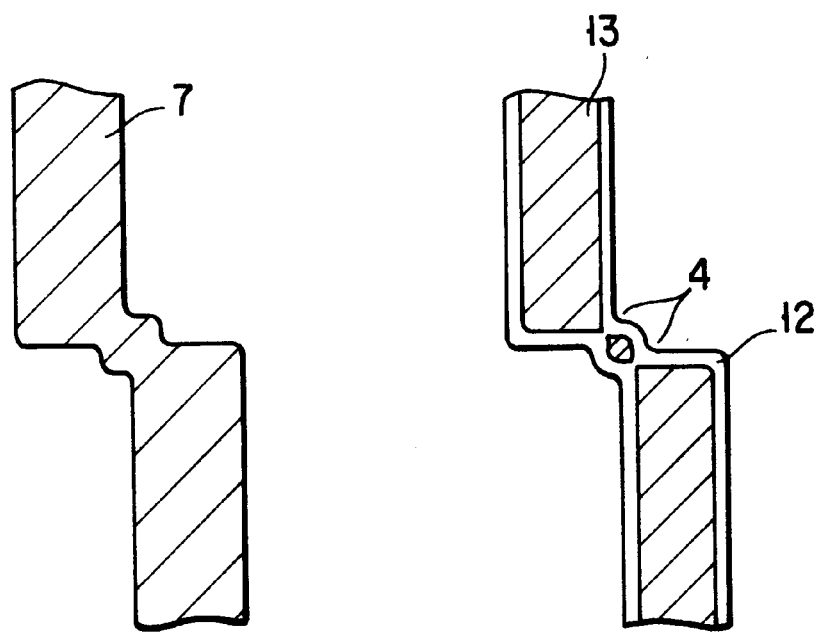
FIG. 5A is a view for explaining degradation of a pattern.
FIG. 5B is a view showing a modification for correcting the degradation of the pattern in the method of manufacturing a circuit element in the first embodiment.

In this case, a tunneling portion can be formed of an appropriate oxide film, as shown in FIG. 5B, by subjecting the entire substrate to oxidation under a condition of 850° C., for example. In the figure, a reference 12 denotes a thermal oxide film and a reference 13 denotes crystallized silicon recrystallized by a heat treatment.

More preferably, a required oxidization amount is previously estimated before the heat treatment, and a desired oxidation amount is determined, based on the result of the estimation. For example, the wire resistance of a pattern including a junction portion is measured, and a desired oxidation amount is determined, based on the resistance value. In this manner, yield of products can be greatly improved.

In addition, it is advantageous that a low resistance can be realized since recrystallization takes place by the heat treatment in the oxidation processing.

Also, once a pattern is finished as shown in FIG. 5A, recovery can be made by carrying out an etching step having strong isotropy such as a chemical dry etching (CDE) or the like after processing of the substrative amorphous Si film 7.

(Second Embodiment)

FIGS. 6A to 6G are cross-sections showing a part of steps of manufacturing a circuit element, according to a second embodiment.

At first, like in the first embodiment, a thermal oxide film 6 of 200 nm is formed on a Si substrate 5, as shown in FIG. 3A, and an amorphous Si film 7 of 30 nm is deposited thereon. A positive type resist is coated thereon by a rotational coating manner, and thermal processing is carried out, to form a resist 8 having a film thickness of 80 nm.

Subsequently, exposure is carried out with an X-ray. In this exposure, exposure light having a center wavelength of 0.8 nm is used with use of a beam line as a light source comprising a mirror and a vacuum partition Be film.

Figure 7A:
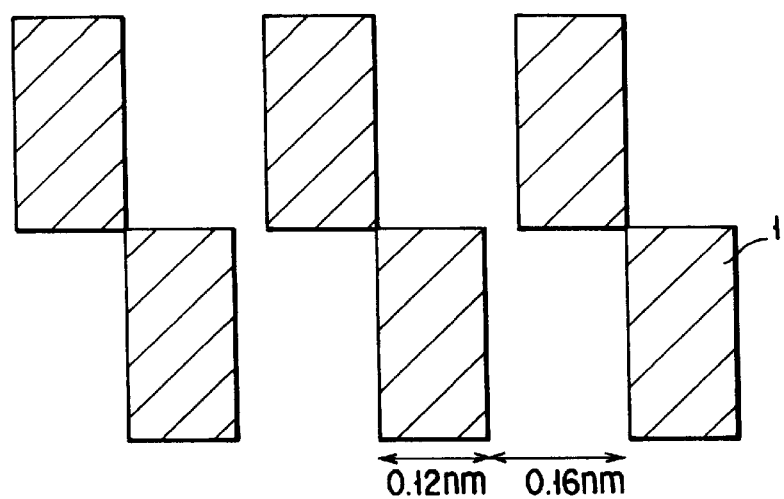
FIGS. 7A, 7B and 7C are plan views for explaining a pattern forming principle in the second embodiment.
Figure 7B:
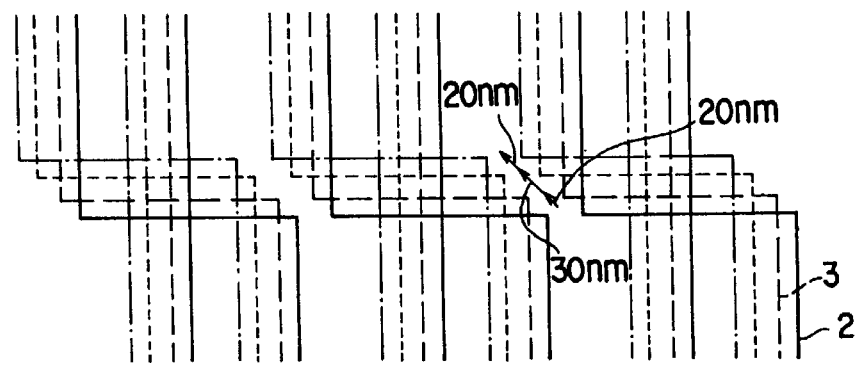
Figure 7C:
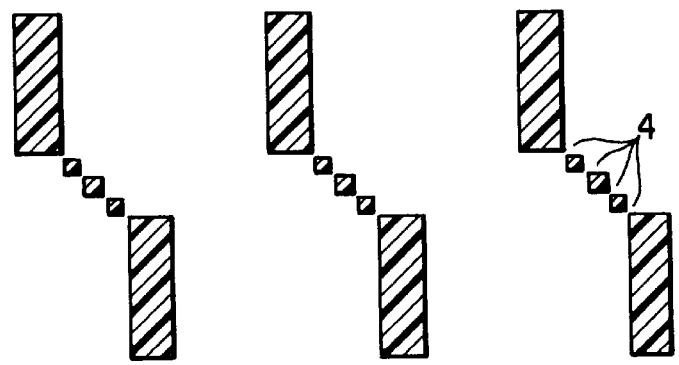

Further, an X-ray mask of an absorbent having a mask contrast 9 which has a pattern as shown in FIG. 7A is used. At first, a mask pattern having a shape shown in FIG. 7A is transferred at a dose of 950 mJ/cm$^2$ (not shown). Subsequently, the mask is moved parallel by 20 nm, as shown in FIG. 7B.

Figure 6A:
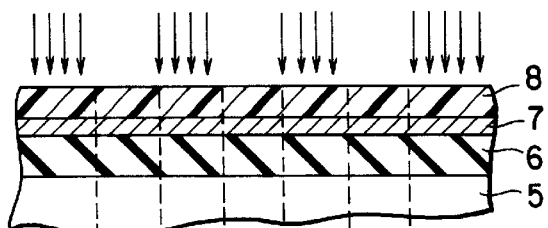
FIGS. 6A, 6B, 6C, 6D, 6E, 6F and 6G are views of operation steps, showing a part of a method of manufacturing a circuit element in a second embodiment.
Figure 6B:
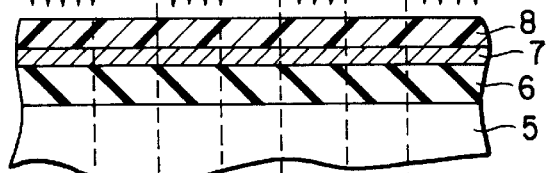

Next, transfer is carried out again with a dose of 1050 mJ/cm$^2$ (FIG. 6B). Further, the mask is moved parallel by 30 nm, and transfer is carried out with a dose of 950 mJ/cm$^3$ (not shown). The mask is again moved parallel by 20 nm, and transfer is carried out with a dose of 950 mJ/cm$^2$.

This operation is repeated by a so-called step-and-repeat manner to perform transfer over the entire surface of the Si substrate.

Figure 6C:
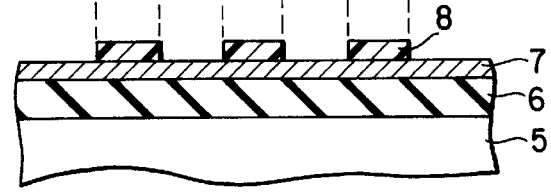

Next, developer (ZEP-RD) is used to make processing for two minutes, and thereafter, a rinsing liquid (MIBK) is used to perform rinsing processing for one minute, to remove exposed portions of the resist 8, as shown in FIG. 6C.

Figure 6D:
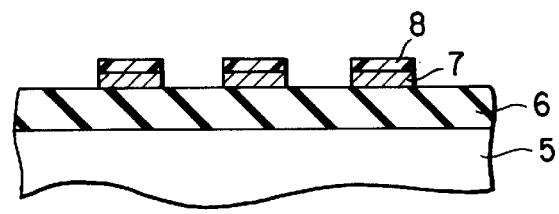

Subsequently, as shown in FIG. 6D, the substrative amorphous Si film 7 is selectively etched with the resist 8 used as a mask, by reactive ion etching using a HBr gas.

Figure 6E:
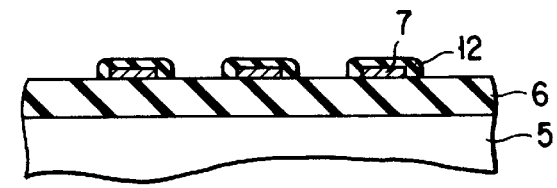

Further, as shown in FIG. 6E, thermal oxidation is carried out under a condition of 850° C. to form a thermal oxide film 12, after removal of the resist 8 which is not required any more, so that a tunnel junction portion is formed into a desired shape.

Figure 6F:
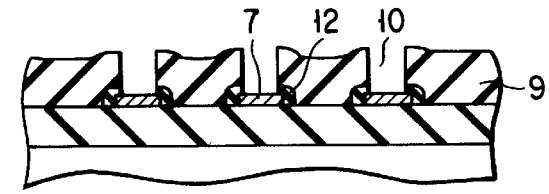

Subsequently, as shown in FIG. 6F, a BPSG film 9 as an insulating film is formed to be a film of 300 nm. Thereafter, a pattern of an opening portion for connecting wires is formed by a lithography step, and an opening portion 10 which reaches Si is formed by reactive ion-etching with use of a CHF$_3$ gas and a CO gas.

Figure 6G:
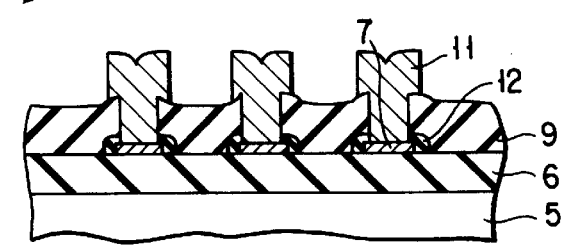

Next, as shown in FIG. 6G, the resist which is not required any more is removed, and thereafter, a P-doped polysilicon film is formed on the entire surface including the opening portion, by a CVD method. Further, a wiring pattern 11 is formed also by a lithography step and by reactive ion etching with use of a HBr gas.

An element formed through the above steps constitutes a so-called multiple junction in which an intermediate island is sandwiched between relatively small islands at both ends, so that charges can be stably stored and very useful advantages can be obtained in application.

A complicated shape as described above is difficult to form by a conventional exposure method, and it is not easy to reduce variation in a chip if formed. However, such a shape can be formed with reduced variation by using the present embodiment.

Although the above-described embodiment uses Si as a conductive thin film, it is naturally possible to apply various kinds of impurities such as B, P, As and the like to improve the electric conductivity, and also to use other materials, e.g., semiconductors such as Ge, GaAs, and the like, metals such as Al, Cr, W, Ta, and the like, or a mixture material such as a metal alloy.

In addition, the method of processing is not limited to reactive ion etching, but conductive and non-conductive portions can be formed by selective doping or the like. Further, the method of oxidation is not limited to thermal oxidation, but it is possible to use any other method such as exposure to an oxygen plasma or the like.

Figure 8A:
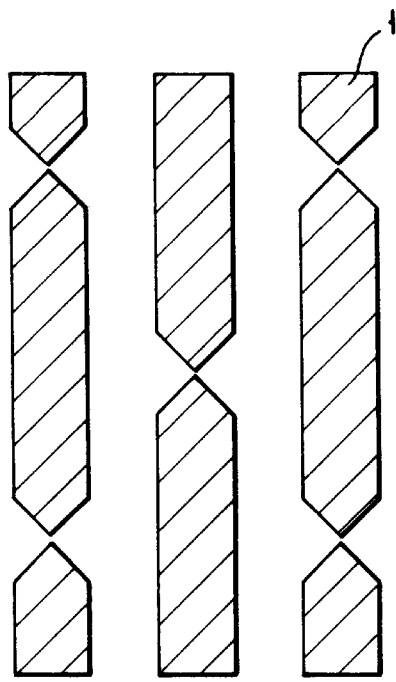
FIGS. 8A, 8B and 8C are plan views for explaining a pattern forming principle in the second embodiment.
Figure 8B:
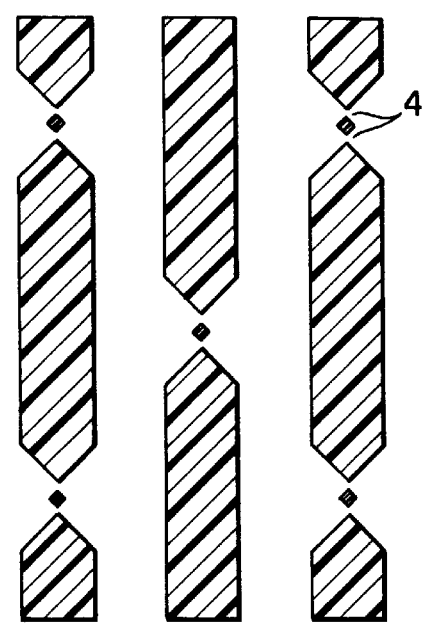

The pattern of a mask used for transfer is not limited to a pattern as shown in FIG. 2A or 7A, but exposure may be performed for two times with use of a pattern as shown in FIG. 8A, to obtain a pattern as shown in FIG. 8B.

Figure 8C:
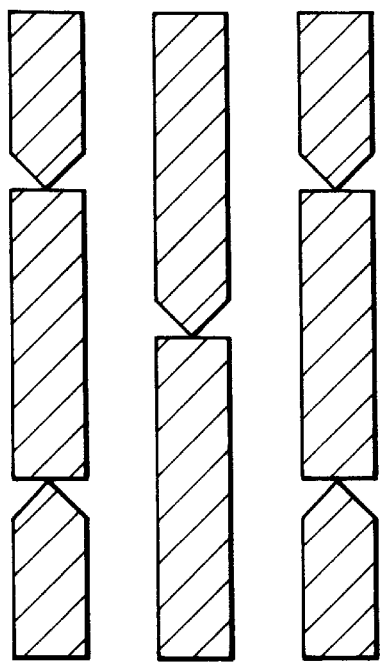

Furthermore, the pattern of a mask as shown in FIG. 8C can be used.

The parallel movement during transfer is achieved by driving a piezoelectric element for fine movement of a stage on which a mask is mounted, but may naturally be achieved by driving a piezoelectric element for fine movement of a stage on which a wafer is mounted.

In addition, the transfer position can be moved parallel by changing incidence angles of exposure light with respect to a mask surface and a wafer surface, for example, by moving parallel a swing mirror for enlarging an exposure area, provided in the beam line for exposure.

Figure 9:
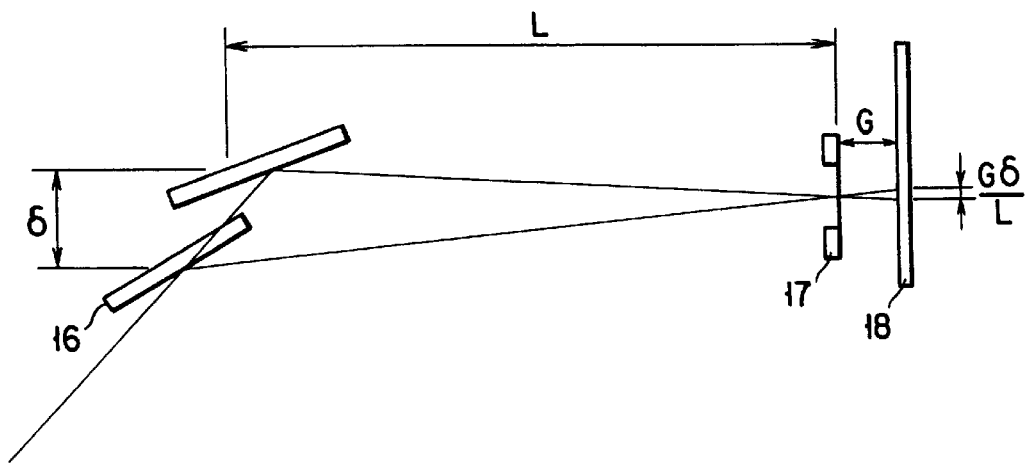
FIG. 9 is a view showing an example of using a reflection mirror for a parallel movement during transfer.

Specifically, as shown in FIG. 9, if the position of the mirror 16 when performing exposure for the first time is different by δ in the surface direction of the wafer from the position of the wafer when performing exposure for the second time, it is found that the positions of patterns transferred by exposure for the first and second times are different from each other by Gδ/L where the distance from the mirror 16 to the mask 17 is expressed as L and the distance from the mask 17 to the wafer 18 is expressed as G.

Therefore, in case of performing exposure with use of a beam line having L=10 m under a condition of G=10 μm, for example, the position where a pattern is transferred can be moved parallel by 30 nm when the mirror is moved 3 cm in the surface direction of the wafer (δ=3 cm).

Although the embodiment uses an X-ray in the lithography step, any other lithography means such as a ultraviolet beam, an electron beam, an ion beam, or the like can be used, and the embodiment is also applicable to various kinds of fine elements.

(Third Embodiment)

Next will be explained an example in which the present invention is applied to prepare a different element from the above.

Figure 10A:
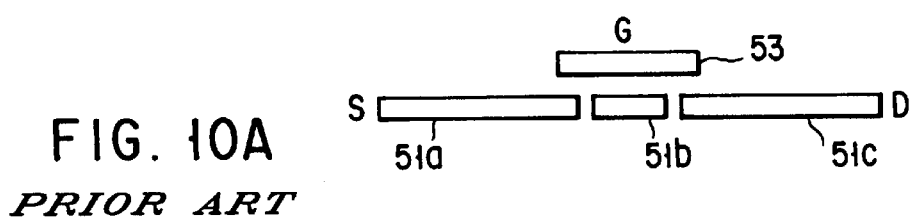
FIG. 10A is a view showing a basic structure of a single-electron tunneling element.

FIG. 10A shows a basic structure of a single-electron tunneling element. Conductive layers 51a, 51b, and 51c are formed from one same layer, and the layers 51a and 51b are to be close to each other with a fine small clearance interposed therebetween and the layers 51b and 51c are also arranged to be close to each other with a fine small clearance interposed therebetween. A conductive layer 53 formed from another layer is formed on the layers 51a, 51b, and 51c, with an insulating layer inserted therebetween.

If the conductive layers 51a and 51c are taken as a source and a drain (S and D) and the conductive layer 53 is taken as a gate (G), these layers can be considered as a transistor. However, this structure has a problem that the potentials of the source S and drain D are influenced by the potential of the gate G.

Figure 10B:
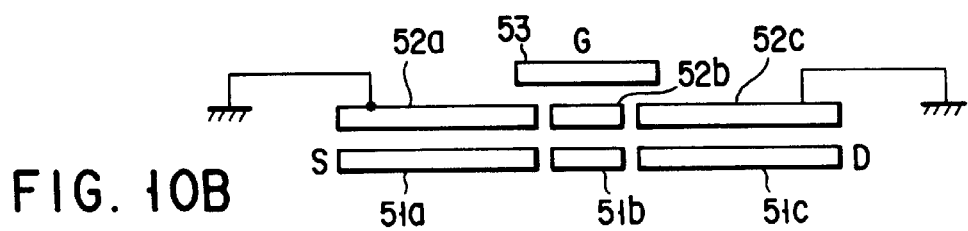
FIG. 10B is a view showing a basic structure of a single-electron tunneling element in the present embodiment.

In the present embodiment, conductive layers 52a, 52b, and 52c formed from another layer are provided between the layer of the source S and drain D and the layer of the gate G, as shown in FIG. 10B, and the conductive layers 52a and 52c forming an upper layer are grounded while the conductive layer 52b is floated. In this structure, an electric field caused by the gate G is applied to the conductive layer 51b forming a lower layer, since the upper conductive layer 52b is floating. In addition, the grounded conductive layers 52a and 52c prevent the potentials of the source S and drain D from being influenced by the potential of the gate G.

Figure 11A:
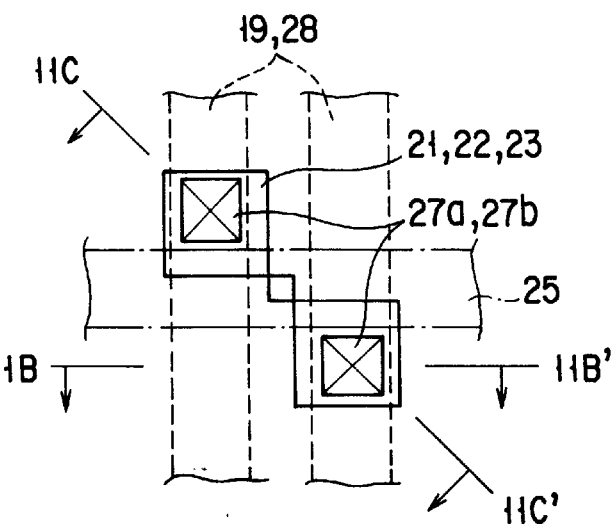
FIG. 11A is a plan view showing a single-electron tunneling element in a third embodiment of the present invention.
Figure 11B:
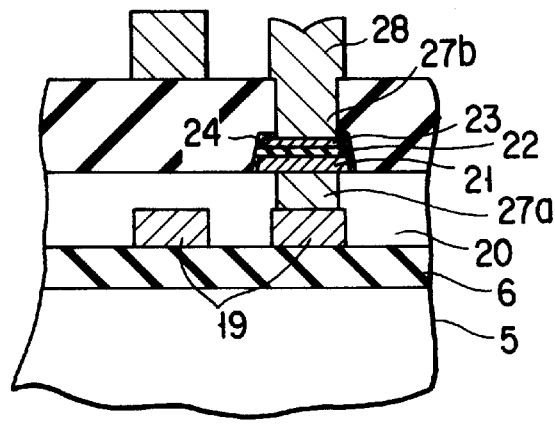
FIGS. 11B and 11C are cross-sections showing a single-electron tunneling element.
Figure 11C:
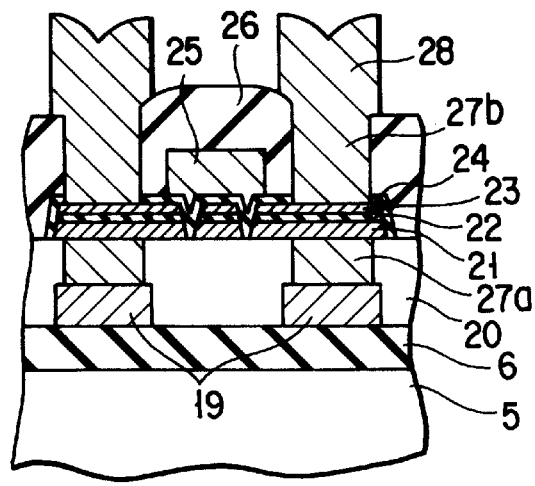

FIG. 11A is a plan view for explaining a single-electron tunneling element according to the present embodiment. FIGS. 11B and 11C are cross-sections for explaining a single-electron tunneling element according to the present embodiment.

FIGS. 12A to 12M are cross-sections showing the process of forming a single-electron tunneling element corresponding to FIG. 11C. The cross-sections shown in FIGS. 11C and 12A to 12M are cut at a position slightly shifted from the center of the element, for conveniences.

Figure 12A:
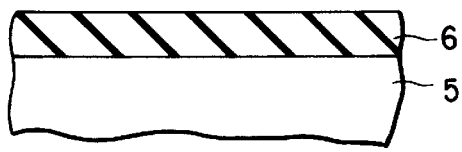
FIGS. 12A, 12B, 12C, 12D, 12E, 12F, 12G, 12H, 12I, 12J, 12K, 12L and 12M are cross-sections showing a single-electron tunneling element in the third embodiment of the present invention.

At first, as shown in FIG. 12A, a thermal oxide film 6 is formed to be 200 nm at a temperature of 950° C. on a Si substrate 5 subjected to cleaning processing by a diluted hydrofluoric acid, to electrically insulating an element to be formed from the substrate.

Figure 12B:
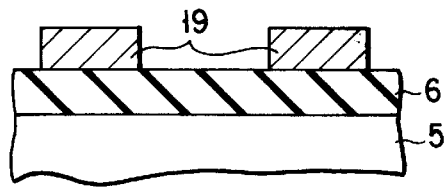

Subsequently, as shown in FIG. 12B, a film having a thickness of 200 nm is formed of tungsten by a spattering method. Thereafter, a positive resist is applied to have a film thickness of 200 nm, and a wiring pattern is formed by a normal X-ray lithography step.

Based on a resist pattern thus obtained, the tungsten film is processed by reactive ion etching with use cf a fluoric gas, to form a first wire 19.

Figure 12C:
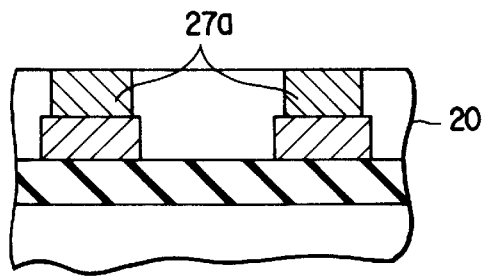

Next, as shown in FIG. 12C, by a CVD method using TEOS as a main material, a first interlayer insulating film 20 made of $SiO_2$ and having a film thickness of 300 nm is formed. Thereafter, a positive resist is coated to have a film thickness of 200 nm, and a contact hole pattern is formed by a normal X-ray lithography step.

Based on a resist pattern thus obtained, a contact hole 27a which reaches the first wire is formed by reactive ion etching with use of a $CHF_3$ gas and a CO gas. Thereafter, a film of tungsten to fill the contact hole is formed by a CVD method, and unnecessary portions of the tungsten film formed at portions other than the contact hole are removed by CMP thereby to obtain a flat surface shape.

Figure 12D:
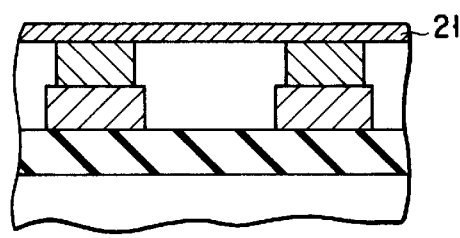

Subsequently, as shown in FIG. 12D, a first amorphous Si film 21 of 30 nm doped with phosphorus is deposited by a LPCVD method with use of disilane doped with phosphine as a source gas onto an oxide film under a condition of a substrate temperature of 480° C. at a pressure of 0.3 Torr.

Figure 12E:
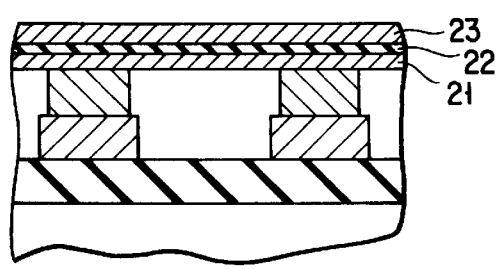

Next, as shown in FIG. 12E, by a CVD method using TEOS as a main material, a second interlayer insulating film 22 made of $SiO_2$ and having a film thickness of 10 nm is formed on the amorphous Si film 21. Further, a second amorphous Si film 23 of 30 nm doped with phosphorus is deposited by a LPCD method with use of disilane doped with phosphine as a source gas onto an oxide film under a condition of a substrate temperature of 480° C. at a pressure of 0.3 Torr.

Figure 12F:
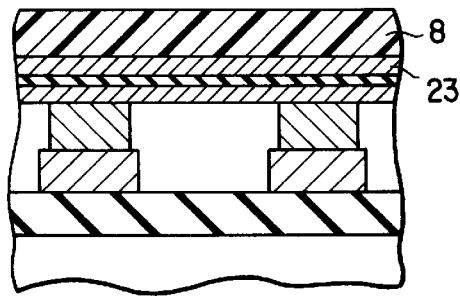

Subsequently, as shown in FIG. 12F, a positive resist (ZEP-520) is coated on the second amorphous Si film 23 by a rotational coating manner, and a heat treatment is performed for two minutes at 175° C., to form a resist film 8 having a film thickness of 80 nm.

Next, as shown in FIGS. 3B and 3C, exposure is carried out by an X-ray. In this exposure, exposure light having a center wavelength of 0.8 nm is used by a beam line as a SOR light source comprising a mirror and a vacuum partition Be film, and an X-ray mask of an absorbent having a mask contrast 9 is used. At first, a mask pattern having a shape as shown in FIG. 2A is transferred at a dose of 1100 $mJ/cm^2$. Next, a piezoelectric element for making a fine movement of a stage on which the mask is mounted is driven to move parallel the mask by 30 nm, as shown in FIG. 2B, and transfer is carried out again with a dose of 1100 $mJ/cm^2$ (FIG. 3C).

Figure 12G:
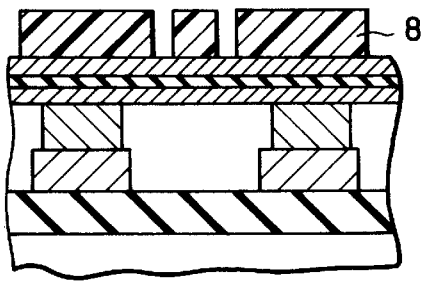

The above operation is repeated by a so-called step-and-repeat manner to perform transfer over the entire surface of the Si substrate. Subsequently, developer (ZEP-RD) is used to make processing for two minutes, and thereafter, a rinsing liquid (MIBK) is used to perform rinsing processing for one minute, to remove exposed portions of the resist 8, as shown in FIG. 12G.

Figure 12H:
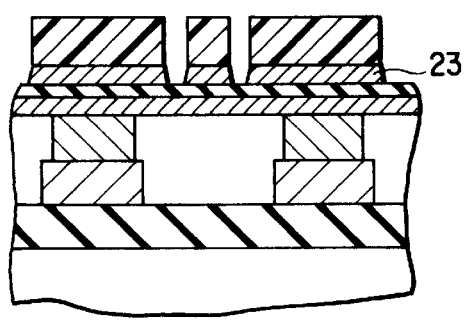

Subsequently, as shown in FIG. 12H, the substrative second amorphous Si film 23 is processed with the resist 8 used as a mask, by reactive ion etching using a HBr gas.

Figure 12I:
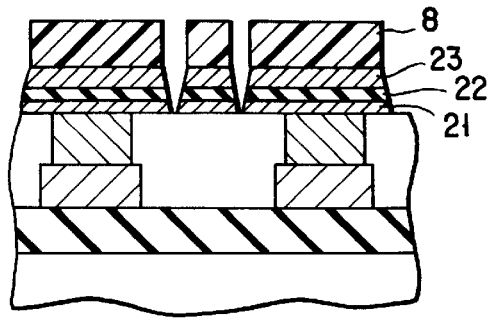

Further, as shown in FIG. 12I, the gas is replaced with $CHF_3$ gas and a CO gas, the second inter-layer insulating film is processed by reactive ion-etching, and thereafter, reactive ion-etching is carried out again with use of a HBr gas to process the first amorphous Si film.

Figure 12J:
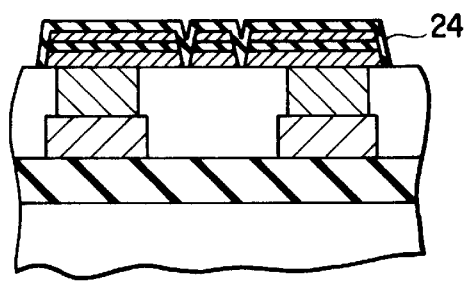

Next, as shown in FIG. 12J, the resist which is not required any more is removed, and thereafter, thermal oxynitridation is carried out by applying a NO gas under a condition of a temperature of 850° C., to form a tunnel junction portion in a desired shape and to form an oxyinitride film 24 on the surface.

Subsequently, a tungsten film having a film thickness of 300 nm is formed by a spattering method, and thereafter, a positive resist is coated to have a film thickness of 200 nm. Then, a second wiring pattern is formed by a normal X-ray lithography step.

Figure 12K:
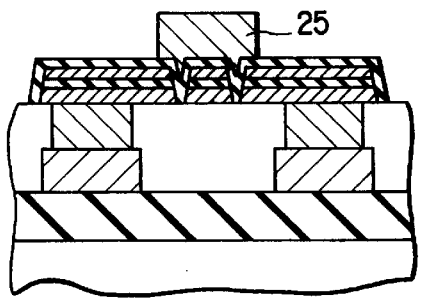

Based on a resist pattern thus obtained, the tungsten film is processed by reactive ion etching with use of a fluoric gas, to form a second wire 25 as shown in FIG. 12K.

Figure 12L:
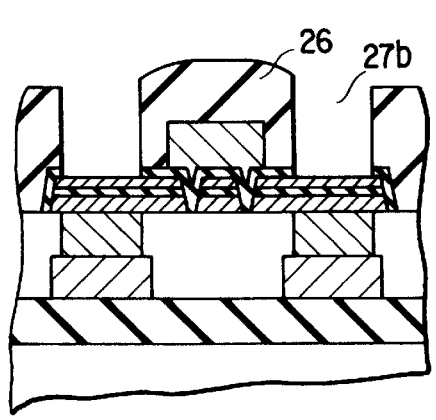

Further, as shown in FIG. 12L, a BPSG film as a third inter-layer insulating film 26 is formed to have a thickness of 300 nm. Thereafter, an opening portion pattern for connecting wires is formed by a normal lithography step, and a contact hole 27b which reaches Si is formed by reactive ion-etching with use of a $CHF_3$ gas and a CO gas.

Figure 12M:
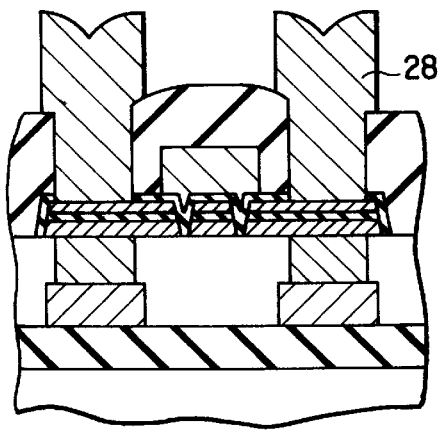

Subsequently, as shown in FIG. 12M, the resist which is not required any more is removed, and thereafter, a P-doped polysilicon film is formed to be 500 nm on the entire surface including the contact hole, by a LPCVD method. Further, a third wiring pattern 28 is formed also by a normal lithography step and by reactive ion etching with use of a HBr gas. Thereafter, a protect insulating film is formed like in case of a normal circuit element, and wires are connected.

The element formed through the steps as described is a three-terminal element in which the first wiring layer corresponds to a connection wire to a source and a drain and the second wiring layer corresponds to a gate. The third wiring layer is normally kept at a ground potential and functions so that an electric field generated by a voltage applied to the second wiring layer as a gate makes influences on only an intermediate island but does not make influences on the source and drain. As a result, it is possible to control the current-voltage characteristic between the source and the drain by using the potential of the gate.

In order to make this element function, two conductive layers sandwiching at least one insulating layer may be formed, and these layers may be formed such that another conductive layer is formed to be adjacent to at least one of the two conductive layers with an insulating layer inserted therebetween, in a manner in which a pattern including a narrowed portion is moved parallel in a direction which is not parallel to a segment forming the outer circumference of the narrowed portion after first exposure and is processed with use of a resist pattern formed by performing second exposure. A high degree of freedom is therefore allowed for the layout of the other wiring layers.

For example, elements having various cross-sectional shapes as shown in FIGS. 13A to 13D can be formed, and as for the planar shape, various shapes and layouts as shown in FIGS. 14A to 14E can be formed.

Figure 13A:
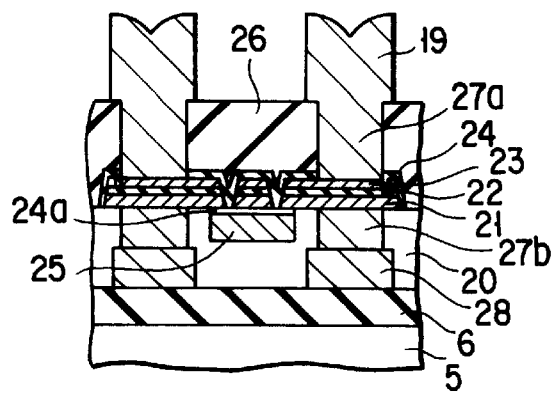
FIGS. 13A, 13B, 13C and 13D are cross-sections showing a modification example of a single-electron tunneling element in the present embodiment.
Figure 13B:
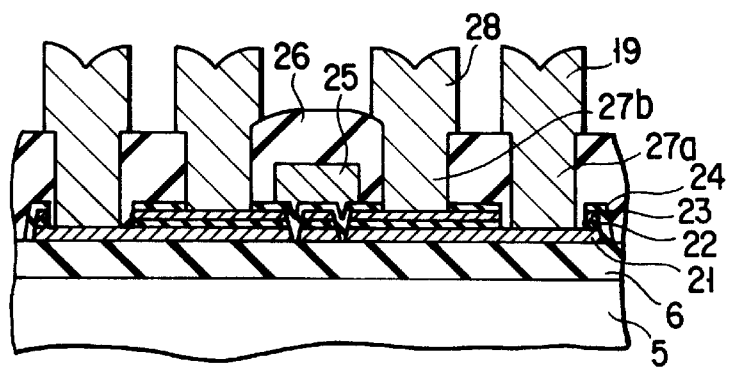
Figure 13C:
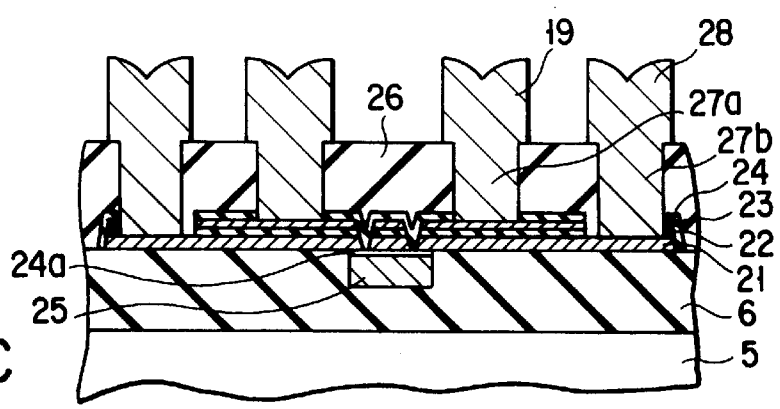
Figure 13D:
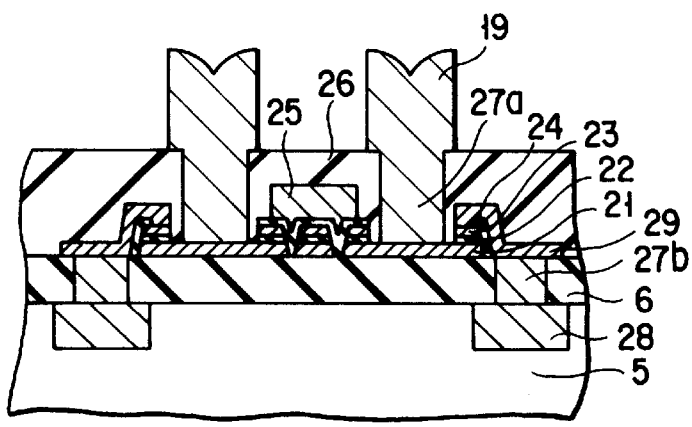

Specifically, a gate may be provided below two conductive layers sandwiching an insulating layer, as shown in FIGS. 13A and 13C, or an electrode lead from a lower conductive layer may be provided in the upper side as shown in FIGS. 13B and 13C. As shown in FIG. 13D, an electrode lead from the upper conductive layer may be provided in the lower side.

Figure 14A:
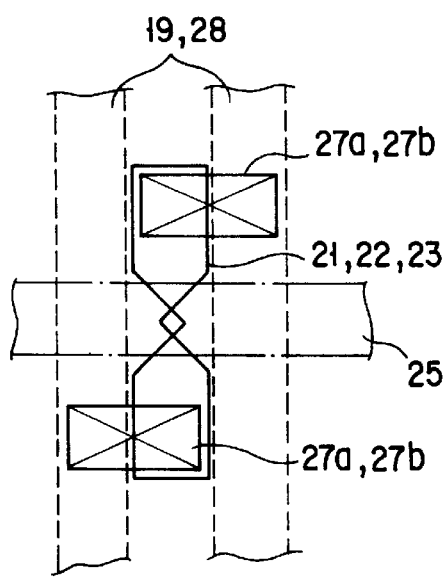
FIGS. 14A, 14B, 14C, 14D and 14E are plan views showing a modification example of a single-electron tunneling element in the present embodiment.
Figure 14B:
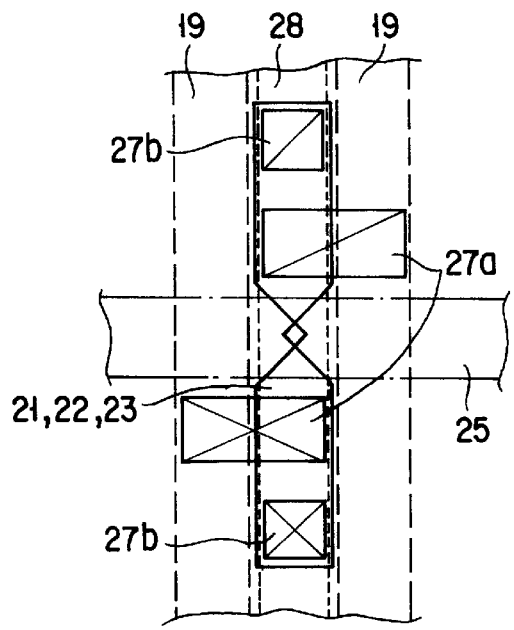
Figure 14C:
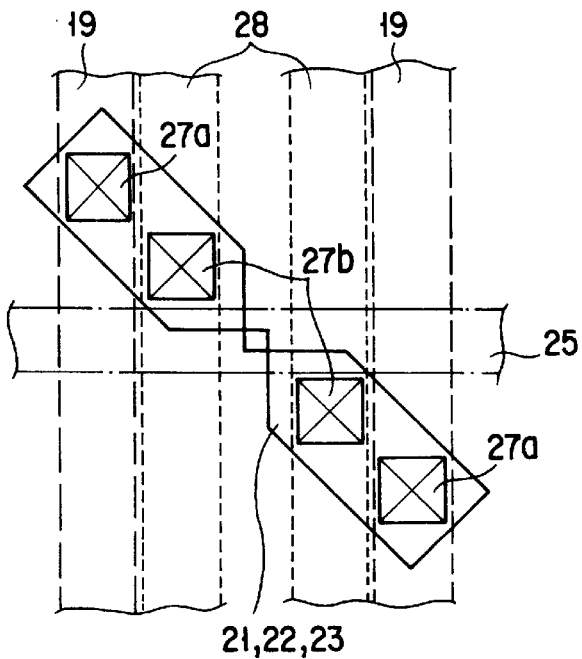

The layout of wires may be arranged as follows. As shown in FIG. 14A, wires 19 and 28 may be layered on each other, occupying an area equivalent to two wires. As shown in FIG. 14B, the wires 19 and 28 may be shifted from each other and the wire 28 may be used in common, occupying an area equivalent to three wires. As shown in FIG. 14C, the wires 19 and 28 may be shifted, occupying an area equivalent to four wires.

Figure 14D:
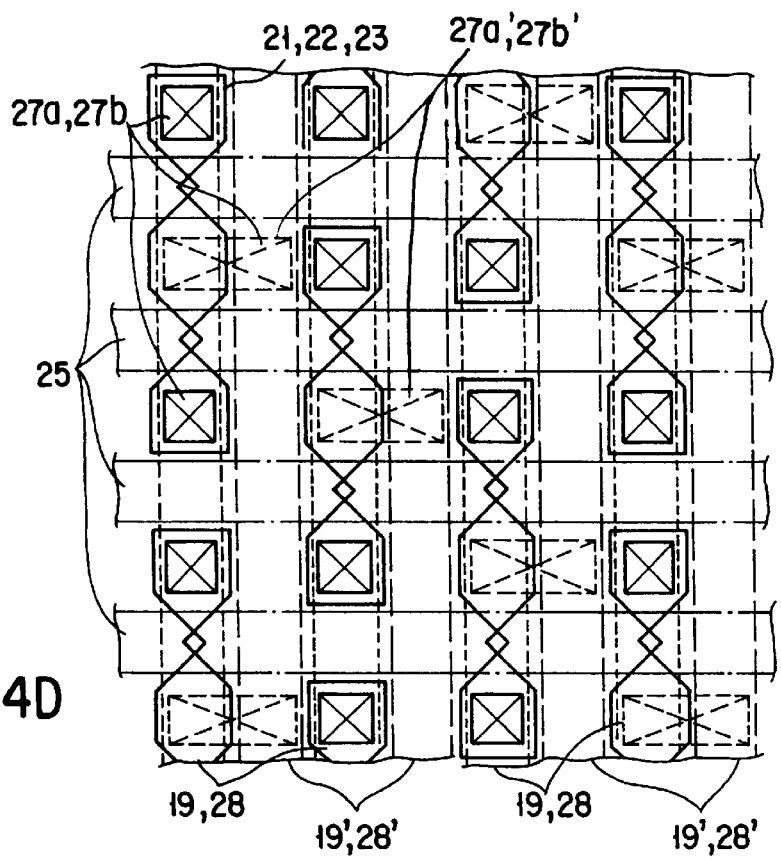
Figure 14E:
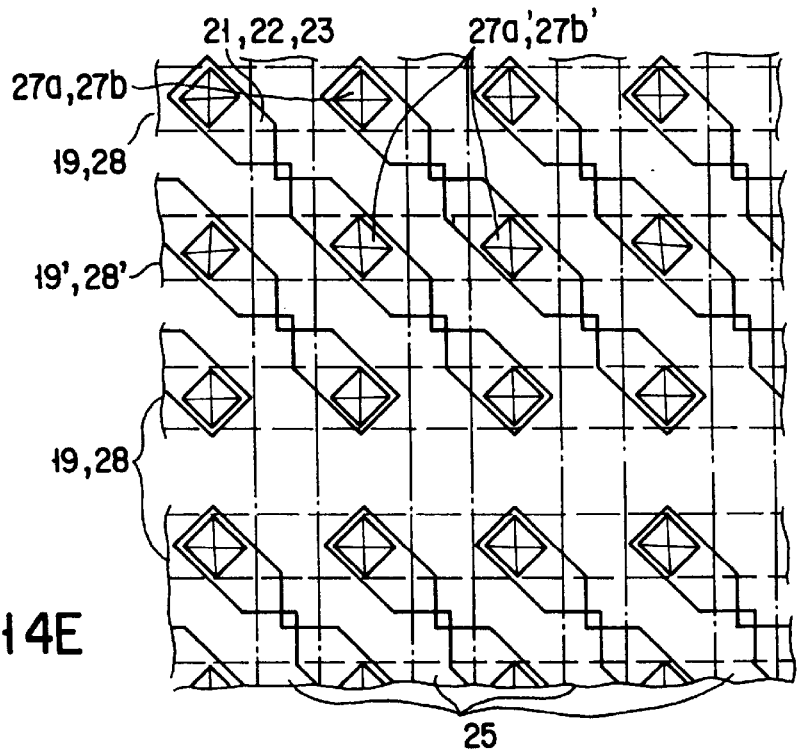

Further, in case of arranging circuit elements on an array, the layout may be as shown in FIGS. 14D and 14E. Wires 19, 28 are connected to one device via the contact holes 27a, 27b represented by a solid line, and wires 19', 28' are connected to another device via the contact holes 27a', 27b' represented by a broken line.

As for the wiring layers and conductive layers described herein, it is possible to use not only a method in which a metal and a doped semiconductor are subjected to film formation and thereafter to etching, but also a method of forming conductive and non-conductive portions by selective doping. As for the inter-layer insulating films, thermal oxidation, it is possible to use various methods such as a CVD method, a spattering method, a manner of rotational coating, and the like, as well as various materials such as oxide films, nitride films, oxynitride films and the like.

In addition, various modifications may be practiced without deviating from the subject matter of the present invention.

As has been described above, according to the present invention, after first exposure is carried out for a pattern having a narrowed portion, the pattern is moved parallel in a direction which is not parallel to a segment forming the outer circumference of the narrowed portion, and further, second exposure is carried out. In this manner, a pattern which is finer than a limit of a pattern obtainable in case of using a normal exposure method can be formed with a practically useful throughput and accuracy.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a circuit element, comprising:
   performing first exposure for transferring a pattern comprising a first pattern portion and a second pattern portion adjacent to the first pattern portion onto an exposure target substrate, the first pattern portion having a corner point opposing the second pattern portion for forming a particular pattern which is used in a circuit element;
   moving the pattern, transferred on the exposure-target substrate, in a slanting direction with respect to each of segments forming an outer periphery of the first pattern portion, which is adjacent to the corner point of the first pattern portion, such that each of the segments forming the outer periphery of the pattern before moving and that of the pattern after moving are in parallel with each other; and
   performing second exposure for transferring the pattern onto the exposure-target substrate to generate the particular pattern which is used in the circuit element.

2. A method of manufacturing a circuit element, according to claim 1, wherein a range in which the pattern is moved is within a range of a circuit element pattern which is transferred onto the exposure-target substrate.

3. A method of manufacturing a circuit element, according to claim 1, wherein a range in which the pattern is moved on the exposure-target substrate is within a range which is a critical wire width, exposed on the exposure-target substrate, of the pattern of a mask.

4. A method of manufacturing a circuit element, according to claim 1, wherein the pattern is moved by moving a mask stage on which a mask used as an original for exposure is mounted.

5. A method of manufacturing a circuit element, according to claim 4, wherein the mask stage is moved by using a piezoelectric element.

6. A method of manufacturing a circuit element, according to claim 1, wherein the pattern is moved by moving an exposure-target substrate stage on which the exposure-target substrate is mounted.

7. A method of manufacturing a circuit element, according to claim 6, wherein the exposure-target substrate stage is moved by using piezoelectric element.

8. A method of manufacturing a circuit element, according to claim 1, wherein the pattern is moved by moving a mirror included in an optical system for exposure.

9. A method of manufacturing a circuit element, according to claim 1, wherein the pattern is a pattern for forming a single-electron tunneling element.

10. A method of manufacturing a circuit element, according to claim 1, wherein the first pattern portion and the second pattern portion have a rectangular shape respectively, and the corner point of the first pattern portion is in contact with a corner of the second pattern portion.

11. A method of manufacturing a circuit element, according to claim 1, wherein the second pattern portion has at least one end having a triangular shape, and the corner point of the first pattern portion is opposed to the end of the second pattern portion.

12. A method of manufacturing a circuit element, according to claim 1, wherein the exposure-target substrate includes a semiconductor substrate, a first insulating layer formed on the semiconductor substrate, a conductive thin film formed on the first insulating layer, and a positive resist formed on the conductive thin film, and the positive resist in an exposed portion is removed in the first and second exposure, the method further comprising removing the conductive thin film in a portion where the positive resist is removed, by reactive ion etching.

13. A method of manufacturing a circuit element, according to claim 12, further comprising removing rest of the resist after the step of the reactive ion etching, and forming a thermal oxide film on the conductive thin film.

14. A method of manufacturing a circuit element, according to claim 13, further comprising forming a second insulating layer on the first insulating layer and the thermal oxide film, after forming the thermal oxide film, and of removing the thermal oxide film and the second insulating film on the conductive thin film, thereby to form an opening portion.

15. A method of manufacturing a circuit element, according to claim 14, further comprising forming a wiring layer on the conductive thin film after forming the opening portion.

16. A method of manufacturing a circuit element, according to claim 1, comprising:

forming an island pattern separated from adjacent pattern portions by a gap formed using said first and second pattern portions.

17. A method of manufacturing a circuit element, according to claim 1, comprising:

repeating moving said pattern and performing exposure; and forming a plurality of adjacent island patterns separated from each other and from adjacent pattern portions by a gap formed using said first and second pattern portions.

18. A method of manufacturing a circuit element, according to claim 17, comprising:

moving said pattern in said slanting direction with respect to segments forming an outer periphery of said plurality of adjacent island patterns.

19. A method of manufacturing a circuit element, according to claim 1, wherein a size of the particular pattern which is used in the circuit element depends only on a moving amount of the pattern.

20. A method of manufacturing a circuit element, comprising:

forming a first insulating layer on a conductive region formed on a substrate, a conductive layer on the first insulating layer, and a resist formed on the conductive layer;

performing first exposure for transferring a pattern comprising a first pattern portion and a second pattern portion adjacent to the first pattern portion onto the resist, the first pattern portion having a corner point opposing the second pattern portion for forming a particular pattern which is used in a circuit element;

moving the pattern, transferred on the resist, in a slanting direction with respect to each of segments forming an outer periphery of the first pattern portion, which is adjacent to the corner point of the first pattern portion, such that each of the segments forming the outer periphery of the pattern before moving and that of the pattern after moving are in parallel with each other; and performing second exposure for transferring the pattern onto the resist, thereby to form a resist pattern of the particular pattern which is used in the circuit element;

selectively etching the conductive layer with the resist pattern used as a mask; and removing the resist pattern to form the particular pattern which is used in the circuit element.

21. A method of manufacturing a circuit element, according to claim 20, further comprising:

forming a second insulating layer on the first insulating layer and the conductive layer; and forming a wiring layer above the conductive layer.

22. A method of manufacturing a circuit element, according to claim 21, wherein the wiring layer is electrically connected to the conductive layer.

23. A method of manufacturing a circuit element, according to claim 21, wherein the second insulating layer has an opening portion on the conductive layer and the wiring layer is formed in the opening portion so as to contact with the conductive layer.

24. A method of manufacturing a circuit element, according to claim 20, wherein the pattern is moved by moving a mask stage on which a mask as an original for exposure is mounted.

25. A method of manufacturing a circuit element, according to claim 20, wherein the pattern is moved by moving an exposure-target substrate stage on which an exposure-target substrate is mounted.

26. A method of manufacturing a circuit element, according to claim 20, wherein the circuit element is a single-electron tunneling element.

27. A method of manufacturing a circuit element, according to claim 20, wherein a size of the particular pattern which is used in the circuit element depends only on a moving amount of the pattern.

28. A method of manufacturing a circuit element, according to claim 20, wherein the particular pattern which is used in the circuit element after removing the resist pattern is subjected to thermal oxidation.

* * * * *

UNITED STATES PATENT AND TRADEMARK OFFICE
CERTIFICATE OF CORRECTION

PATENT NO. : 6,248,508 B1
DATED : June 19, 2001
INVENTOR(S) : Murooka et al.

It is certified that error appears in the above-identified patent and that said Letters Patent is hereby corrected as shown below:

Title page,
Item [54], Title, should read:
-- [54] A METHOD OF MANUFACTURING A
CIRCUIT ELEMENT --
Insert Items:
-- [45] **Date of Patent:  \*Jun. 19, 2001**

[\*] Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days. --

Signed and Sealed this

Fifth Day of July, 2005

JON W. DUDAS
*Director of the United States Patent and Trademark Office*